(12) United States Patent
Franken et al.

(10) Patent No.: US 7,035,056 B2
(45) Date of Patent: Apr. 25, 2006

(54) PIEZOELECTRIC ACTUATOR AND A LITHOGRAPHIC APPARATUS AND A DEVICE MANUFACTURING METHOD

(75) Inventors: Dominicus Jacobus Petrus Adrianus Franken, Veldhoven (NL); Bastiaan Stephanus Hendrikus Jansen, Loo (NL)

(73) Assignee: ASML Netherlands B.V., Veldhoven (NL)

( * ) Notice: Subject to any disclaimer, the term of this patent is extended or adjusted under 35 U.S.C. 154(b) by 94 days.

(21) Appl. No.: 10/288,565

(22) Filed: Nov. 6, 2002

(65) Prior Publication Data

US 2003/0123036 A1 Jul. 3, 2003

(30) Foreign Application Priority Data

Nov. 7, 2001 (EP) .................................. 01309445

(51) Int. Cl.
*G01P 15/09* (2006.01)
*G21K 5/10* (2006.01)

(52) U.S. Cl. ............................. 360/294.4; 250/492.22; 250/492.1; 73/514.34; 385/18; 430/311

(58) Field of Classification Search ........... 250/492.22; 360/294.4; 73/514.34; 430/311
See application file for complete search history.

(56) References Cited

U.S. PATENT DOCUMENTS

| 5,610,684 A | 3/1997 | Shiraishi |
| 6,133,986 A | 10/2000 | Johnson |
| 2004/0074300 A1* | 4/2004 | Karrai et al. ............ 73/514.34 |
| 2004/0202898 A1* | 10/2004 | Van Dijsseldonk et al. . 428/701 |

FOREIGN PATENT DOCUMENTS

| EP | 0 360 975 A2 | 4/1990 |
| EP | 0 360 975 A3 | 4/1990 |
| JP | 5-154743 | 6/1993 |
| JP | 2001-297982 | 10/2001 |
| KR | 2001-0095137 | 11/2001 |
| WO | WO 93/19494 | 9/1993 |

* cited by examiner

*Primary Examiner*—John A. McPherson
*Assistant Examiner*—Daborah Chacko-Davis
(74) *Attorney, Agent, or Firm*—Pillsbury Winthrop Shaw Pittman LLP (57) ABSTRACT

A lithographic projection apparatus comprising at least one of a radiation system and a projection system having at least one of a reflective and a refractive optical member, wherein the optical member is supported by at least one piezoelectric actuator for positioning the optical member. The piezoelectric actuator comprises three parallel plates stacked on top of one another with piezoelectric stacks between the plates.

12 Claims, 5 Drawing Sheets

PIEZOELECTRIC ACTUATOR AND A LITHOGRAPHIC APPARATUS AND A DEVICE MANUFACTURING METHOD

This application is based on and claims priority from European Patent Application 01309445.3 filed on Nov. 7, 2001, the contents of which are incorporated herein by reference.

BACKGROUND OF THE INVENTION

1. Field of the Invention

The present invention relates to a piezoelectric actuator and to a lithographic projection apparatus.

2. Description of Related Art

The term "patterning structure" as here employed should be broadly interpreted as referring to a structure that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure includes:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using a suitable electronic structure. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.
- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

A lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

To reduce the size of features that can be imaged, it is desirable to reduce the wavelength of the projection beam of radiation. It has been proposed to use wavelengths of less than about 200 nm, for example 193 nm, 157 nm or 126 nm. Further reductions in the wavelength to the range of EUV (extreme ultra-violet radiation, e.g. having a wavelength in the range of 5–20 nm) are envisaged. EUV radiation in particular is more conveniently focused and controlled by reflective optics, such as mirrors. However, mirrors in lithography apparatus must be positioned to especially high accuracy, as compared to refractive elements, because any rotational orientation errors are magnified by the total downstream optical path length. In any apparatus using very short wavelength radiation, the optical path length may be of the order of 2 m or more.

For example, to have a good overlay performance, it can be necessary to keep the position of an image of an irradiated portion of the mask stable at a given position at substrate level with an error (e) of less than about 1 nm in particular when EUV is used. If the distance between the mirror and the substrate is 2 m the maximum permissible rotational error of the reflected beam, to keep the system within specification, is $28 \times 10^{-9}$ degrees ($1 \times 10^{-9}$ m/2 m=tan($28 \times 10^{-9}$ degrees)), if e=1 nm. Since, for a mirror, the angle of reflection equals the angle of incidence, a rotational error in the position of the mirror will give rise to twice as large an error in the direction of the reflected beam. Thus, the mirror must be positioned with an accuracy of $14 \times 10^{-9}$ degrees or better. If the mirror has a width of order 0.1 m and a rotating point at one side, that rotating point must be positioned to within 0.024 nm (tan $14 \times 10^{-9} \times 0.1 = 2.4 \times 10^{-11}$). Clearly, the accuracy with which such a mirror must be orientated is extremely high and will only increase as the specification for image accuracy increases. The accuracy requirements for position in X, Y and Z are less demanding, as such errors are magnified less at substrate level, but still remain high.

A projection system for a scanning EUV lithographic projection apparatus may include six mirrors, for example, for reflecting and thereby projecting the patterned beam onto a target portion of the substrate. In this case, the mirrors are to be positioned relative to each other with an accuracy of about 0.1 nm. It has been proposed before to use a plurality of one dimensional actuators for adjusting the position and/or orientation of a reflective optical element. For example, a corresponding arrangement is described in EP 1107068 A2. This document describes the use of position sensors to maintain the reflective element stationary in spite of vibrations that might occur. In particular, the actuators or other components of the lithographic projection apparatus, such as a gravity compensator, might cause such vibrations.

A reflective or refractive optical member has six independent degrees of freedom (DOF)—three transitional and three rotational. One possibility to adjust the optical member with respect to more than one DOF is to use a plurality of actuators. The actuators may be piezoelectric, electro-resistive or magneto-resistive and act, for example, perpendicularly to a surface of the optical member which extends transversely to the beam of radiation incident at the optical member. In the past a plurality of one degree of freedom inch-worms have been used to position the reflective or refractive optical member. In a typical one-dimensional inch-worm actuator four piezoelectric stacks (two opposed pairs) surround a central cylinder which is connected to an actuation rod comprising decoupling portions. Each piezo stack comprises 2 layers of which one is capable of expanding/contracting and the other is capable of shearing in one direction. The central cylinder and the actuation rod which is connected to e.g. a central pin (which in turn is connected to the optical member) can be moved only in the axial direction. These one-dimensional actuators themselves may surround a central pin in opposed pairs to make the arrangement more robust. Breakage of a decoupling portion in one of the one-dimensional actuators leads to failure of the whole actuator. The reason that each one-dimensional actuator must be opposed by another one-dimensional actuator is that a non-symmetric arrangement can lead to over-burdening of a single decoupling portion in an actuator. This requirement makes the whole actuator quite large. In order to provide the optical member with the necessary six degrees of freedom, twelve one-dimensional inch-worm actuators are used in a hexapod arrangement. This results in an eccentric construction that takes up considerable space within the lithographic apparatus.

SUMMARY OF INVENTION

It is an aspect of the present invention to provide a piezoelectric actuator which is compact and multi functional.

This and other aspects are achieved according to the invention in a piezoelectric actuator including two outer plates, an inner plate positioned between the two outer plates, and at least two piezoelectric stacks positioned on at least one side of the inner plate between the inner plate and one of the two outer plates. The outer and inner plates are substantially parallel and the outer plates are biased towards each other by a compression structure.

Such an actuator has the advantage of being compact and is capable of positioning an object in two substantially orthogonal directions. It further requires fewer piezoelectric stacks than four one-dimensional actuators of the prior art. This results in a more compact design. Additionally, if a membrane-like portion extending from the inner plate to a central pin is provided, the design is more robust than conventional designs because it does not require as many decoupling portions as the actuators of the prior art.

According to a preferred embodiment, the at least one piezoelectric actuator is an inch-worm actuator. An inch-worm actuator is an actuator which has a plurality of piezoelectric stacks each comprising at least two layers. One of the layers is for contracting/expanding and another one is for shear. If further layers are present, they can be orientated for shear in different directions to those already present. An inch-worm actuator positioned between two plates and attached to one of those plates makes it possible to move the other of those plates relative to the one with a stepping motion of the inch-worm resulting in a relatively large displacement. The inch-worm actuator also enables relatively small displacements (in sub-nm range) just by shearing one of the layers in each piezo stack, while the stacks are still in contact with both plates.

It is also an aspect of the present invention to provide a lithographic projection apparatus in which the structure for moving the optical member is compact.

This and other aspects are achieved according to the invention in a lithographic apparatus that includes a radiation system for supplying a projection beam of radiation; a support structure for supporting a patterning structure, the pattern structure serving to pattern the projection beam according to a desired pattern; a substrate table for holding a substrate; and a projection system for projecting the patterned beam onto a target portion of the substrate. At least one of the radiation system and the projection system includes at least one optical member and a piezoelectric actuator for positioning the optical member. The piezoelectric actuator is constructed and arranged to position the optical member in two substantially orthogonal directions.

A two-dimensional piezoelectric actuator has layers of piezoelectric material orientated in at least three different directions. Preferably those three different directions are substantially orthogonal. The layers of piezoelectric material of the two-dimensional actuator are generally stacked two or three on top of each other and those stacks may be positioned in a plane.

The optical member is, for example, a mirror or a lens. The at least one piezoelectric actuator serves to position the optical member relative to the projection beam or the pattern beam with an accuracy of up to 0.03 nm or better.

Preferably the optical member is supported by a mounting frame, the frame extending in a plane transverse to a path for radiation to or from the optical member and the frame thereby enclosing, within said plane, the optical member, wherein the optical member is connected to the frame and the frame is connected to said at least one piezoelectric actuator. Thus, by attaching at least three piezoelectric actuators to the frame member it is possible to achieve the desired six degrees of freedom (three transverse and three rotational).

According to a further aspect of the invention there is provided a device manufacturing method including providing a substrate that is at least partially covered by a layer of radiation-sensitive material; providing a projection beam of radiation using a radiation system; using patterning structure to endow the projection beam with a pattern in its cross-section, projecting the patterned beam of radiation onto a target portion of the layer of radiation-sensitive material; using at least one optical member for at least one of reflecting and refracting the projection beam of radiation or the patterned beam; and positioning said optical member in a plane by using at least one piezoelectric actuator which is constructed and arranged to position the optical member in two substantially orthogonal directions.

In a preferred embodiment, the method includes adjusting the propagation direction of the propagation beam of radiation or the patterned beam by adjusting at least one of the position and the orientation of the optical member.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm) as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF PREFERRED EMBODIMENTS

Embodiment 1

Figure 1:
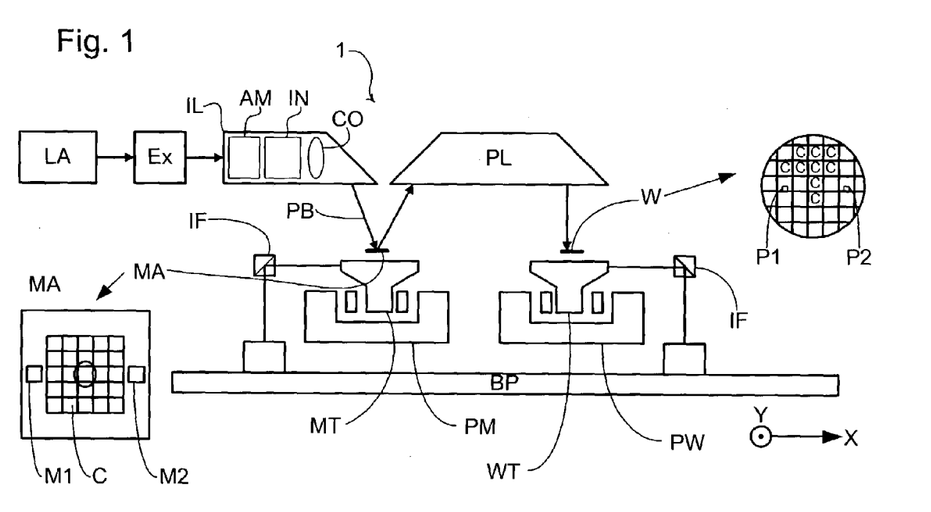
FIG. 1 depicts a lithographic projection apparatus according to an embodiment of the invention.

FIG. 1 schematically depicts a lithographic projection apparatus 1 according to a particular embodiment of the invention. The apparatus 1 includes a radiation system Ex, IL, for supplying a projection beam PB of radiation (e.g. EUV radiation), which in this particular case also comprises a radiation source LA; a first object table (mask table) MT provided with a mask holder for holding a mask MA (e.g. a reticle), and connected to a first positioning structure PM for accurately positioning the mask with respect to item PL; a second object table (substrate table) WT provided with a substrate holder for holding a substrate W (e.g. a resist-coated silicon wafer), and connected to a second positioning structure PW for accurately positioning the substrate with respect to item PL; and a projection system ("lens") PL (e.g. a refractive or catadioptric system or a reflective system) for imaging an irradiated portion of the mask MA onto a target portion C (e.g. comprising one or more dies) of the substrate W.

As here depicted, the apparatus 1 is of a reflective type (i.e. has a reflective mask). However, in general, it may also be of a transmissive type, for example (with a transmissive mask). Alternatively, the apparatus 1 may employ another kind of patterning structure, such as a programmable mirror array of a type as referred to above.

The source LA (e.g. an undulator or wiggler provided around the path of an electron beam in a storage ring or synchrotron, or a mercury lamp) produces a beam of radiation. This beam is fed into an illumination system (illuminator) IL, either directly or after having a traversed conditioning structure, such as a beam expander Ex, for example. The illuminator IL may comprise an adjusting structure AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus 1 (as is often the case when the source LA is a mercury lamp, for example), but that it may also be remote from the lithographic projection apparatus 1, the radiation beam which it produces being led into the apparatus 1 (e.g. with the aid of suitable directing mirrors); this latter scenario is often the case when the source LA is an excimer laser. The current invention encompasses both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning structure PW (and an interferometric measuring structure IF), the substrate table WT can be moved accurately, e.g. so as to position different target portions C in the path of the beam PB. Similarly, the first positioning structure PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus 1 can be used in two different modes:
1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB.
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
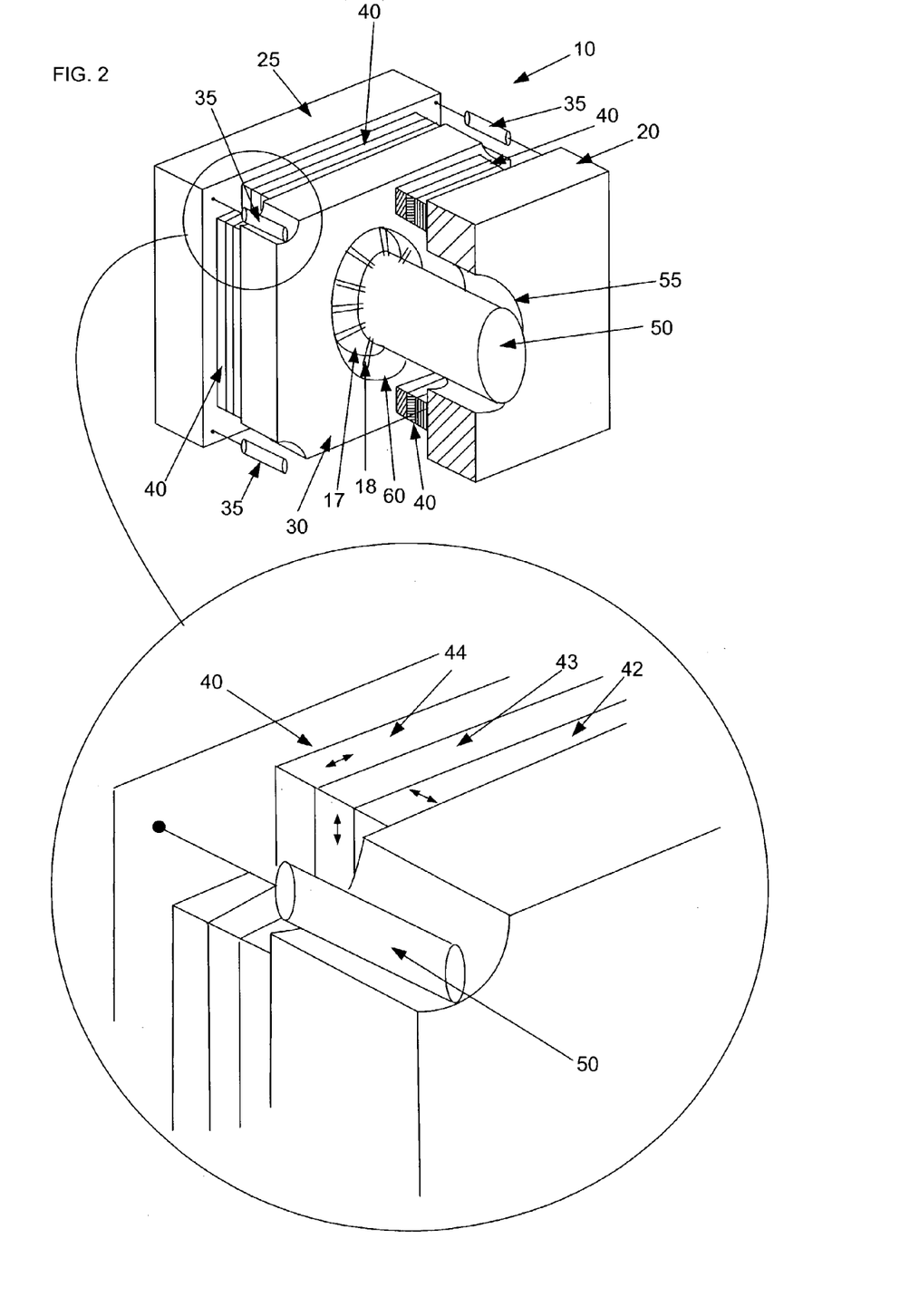
FIG. 2 depicts a cut away projection view of a two-dimensional piezoelectric actuator according to the invention.

FIG. 2 shows a (two-dimensional) piezoelectric actuator 10 for moving an optical member, in particular a mirror, for refracting and/or reflecting radiation that is incident on the circular surface of the optical member.

The two-dimensional piezoelectric actuator 10 comprises a first outer plate 20 and a second outer plate 25. The outer plates 20, 25 may be part of another component of the lithographic projection apparatus 1. An inner plate 30, is positioned between and substantially parallel to the first and second outer plates 20, 25. A compression structure, in the illustrated embodiment in the form of springs 35 connected between the outer plates 20, 25 at each corner, pulls the outer plates 20, 25 together.

Four piezoelectric stacks 40 (so called "inch-worms") are positioned on each side of the inner plate 30 between the inner plate 30 and an outer plate 20, 25. This is the preferred arrangement. However, it is possible to provide four piezoelectric stacks 40 on one side of the inner plate 30 and not on the other side. On the side without piezoelectric stacks, a guide structure is provided which allow low friction movement between the inner plate 30 and the respective outer plate 20, 25. This low friction movement may be provided by the guide structure such as grease or ballbearings. Furthermore, the inner plate 30 may be much larger than illustrated in FIG. 2. For example, the inner plate 30 may be part of a force frame. The four piezoelectric stacks 40 are positioned along the edges of the plates 20, 25, 30. Each piezoelectric stack 40 is comprised of three layers of piezoelectric material. Each layer of piezoelectric material is orientated such that it is capable of expanding or contracting in only one direction, that direction being orthogonal to the direction in which the other two layers of the piezoelectric material in the stack can shear. The directions are indicated by arrows 42, 43 and 44 in the enlarged section of the view. Thus, on electric stimulation, each of those layers accommodates movement in a different direction. In the preferred embodiment, two of the directions are in the same plane as the plates 20, 25, 30.

A central pin 50 is attached to the inner plate 30. This necessitates a cut-out 55 in the first outer plate 20 through which the central pin 50 extends. The central pin 50 is attached to the optical member whereas the second outer plate 25 is attached to components of the lithographic apparatus 1.

This embodiment requires only eight piezoelectric stacks 40 and the three plate configuration is more compact than a two-dimensional actuator using four one-dimensional actuators as described in the introduction.

It is preferred that a cut-out 60 is provided in the center of the inner plate 30. In the cut-out, a membrane 17 is inserted and firmly connected at its outer circumference to the rim of the cut-out area. The membrane 17 can be sheet-like, but a configuration of members 18 shown in FIG. 2 is preferred. The membrane 17 comprises a plurality of spokes 18 which extend between the rim of the cut-out area and the central pin 50. The number and dimension of the spokes 18 may vary, and can, in particular, be adjusted to adjust the de-coupling properties of the membrane 17. Generally, de-coupling means that the optical member is de-coupled from adverse mechanical conditions which may apply to the two-dimensional piezoelectric actuator, such as vibrations or undesired forces that act on the two-dimensional piezoelectric actuator. Furthermore, the shape of the spoked membrane can be different, for example, the spokes 18 may be connected to a ring-like portion of the membrane at the outer and/or inner circumference of the membrane. By providing spokes 18, forces in the four remaining degrees of freedom are decoupled, thereby reducing the quantity of parasitic forces by a factor of about 5 relative to a two-dimensional actuator comprising four one-dimensional actuators as described in the introduction. Moreover, the spokes 18 have an additional advantage that the membrane 17 will still work when one (or a few) spokes are broken.

The inner plate 30 and the membrane 17 may be a single part, for example made of a block of the same material. However, it is preferred that at least the membrane 17 is manufactured separately from the inner plate 30 and are connected in a later manufacturing step to the inner plate 30.

Figure 3:
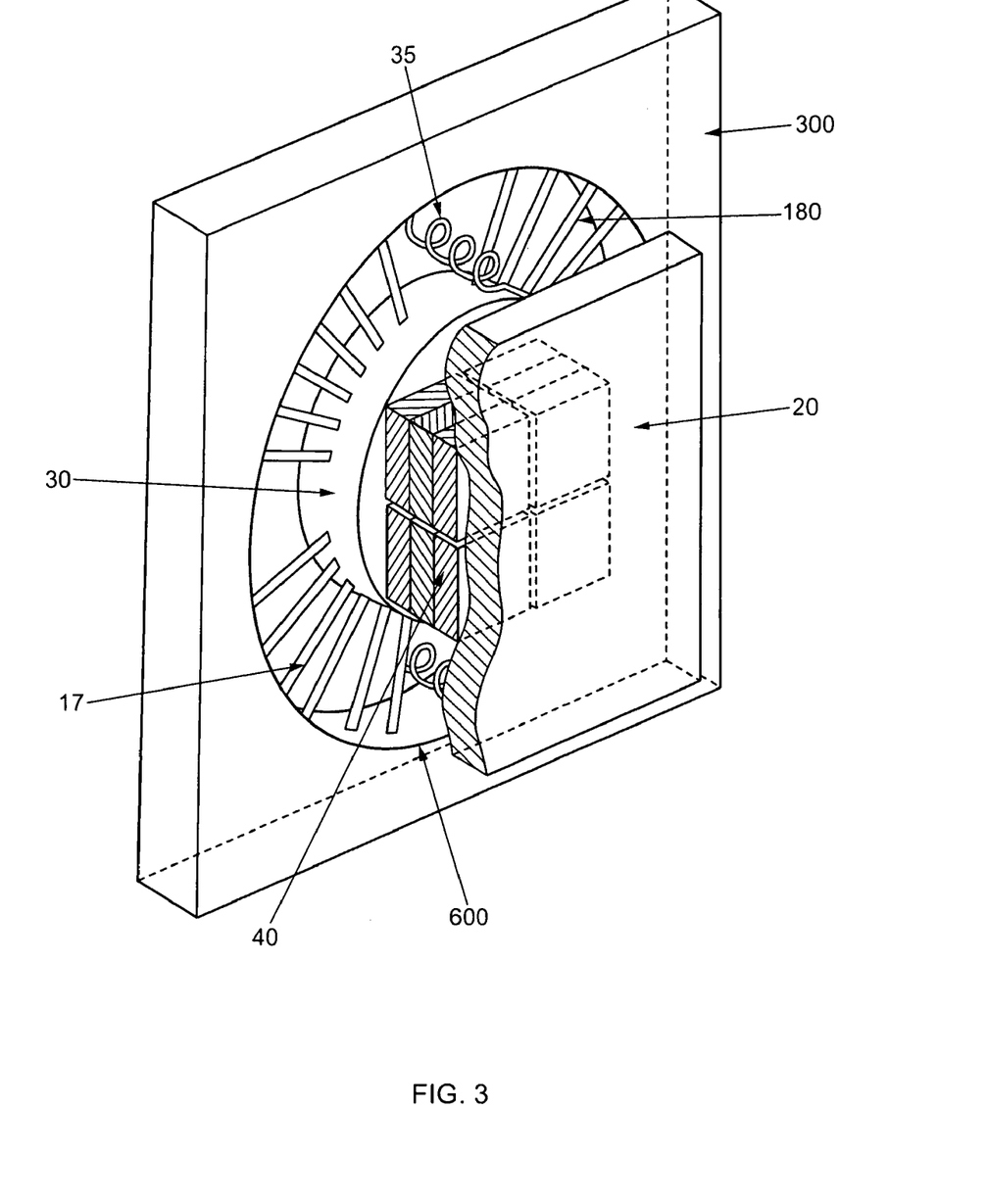
FIG. 3 depicts a cut away projection view of a second embodiment of a two-dimensional piezoelectric actuator according to the invention.

A second embodiment of two-dimensional actuator is illustrated in FIG. 3. In the embodiment illustrated in FIG. 3 the central pin 50 of the first embodiment illustrated in FIG. 2 is not required. This is because a further inner plate 300 with a central cut out 600, is supported by a membrane 17 extending between the outer periphery of the inner plate 30 and the inner peripheral surface of the central cut out 600. Four piezoelectric stacks 40 are positioned between the inner plate 30 and the outer plate 20. Tensioning by springs 35 between the outer plates 20, 25 is accomplished by leaving gaps in the membrane 17 such that the springs may pass through central cut out 600. In this way, movement of the inner plate 30 relative to the outer plates 20, 25 is transferred to the further inner plate 300 via decoupling membrane 17.

Figure 4:
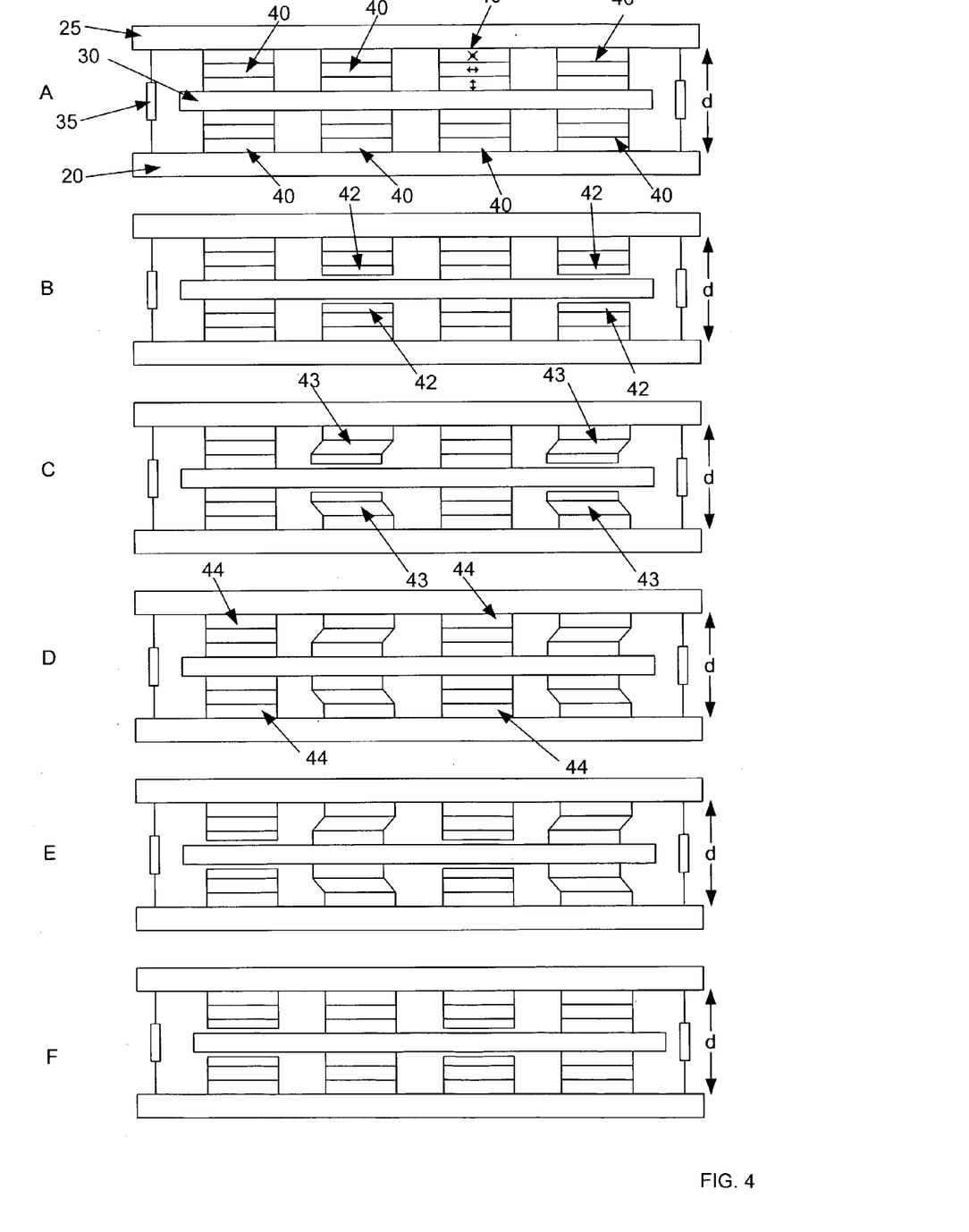
FIG. 4 illustrates movement of an inch-worm actuator.

Movement of the inner plate relative to the outer plates for embodiments illustrated in FIGS. 2 and 3 will now be described with reference to FIG. 4. FIG. 4 is schematic in that it is an unwound cross-sectional view of the actuator illustrated in FIG. 2 so that the stacks 40 are more clearly illustrated in a row rather than partly/wholly obscured by one another.

Each of the piezoelectric stacks 40 are attached, preferably by gluing, to their corresponding outer plate 20, 25. The individual layers 42, 43, 44 of each piezoelectric stack 40 are also adhered to one another, preferably by gluing. The piezoelectric stacks 40 are not adhered to the inner plate 30.

FIG. 4A illustrates the equilibrium position in which all piezoelectric stacks 40 are in contact with both the inner plate 30 and their respective outer plate 20, 25. In order to move the inner plate 30 to the right, two piezoelectric stacks 40 on each side of the inner plate 30 are shortened by actuation of the piezoelectric layer which is orientated in such a direction that contraction/expansion occurs perpendicular to the plane of the plates 20, 25, 30. This is achieved by energizing layers 42 of the second and fourth stacks from the left such that those layers contract (FIG. 4B). Only two piezoelectric stacks 40 on each side of the inner plate 30 are actuated in this way such that the unactuated stacks maintain the distance d between the first and second outer plates 20, 25 constant.

FIG. 4C illustrates the next stage. The piezoelectric layer 43 (which is orientated in such a direction that it expands/contracts to the left or right) of the already contracted stacks 40 (i.e. the second and fourth from the left) is actuated. This results in a displacement of the bottom layer 42 of the second and fourth stacks 40 to the left.

After this stage, the second and fourth stacks from the left are brought back into contact with the inner plate 30 by deactivating the layer 42 which is orientated in a direction of expansion/contraction perpendicular to the plane of the plates 20, 25, 30. This is illustrated in FIG. 4D.

In FIG. 4E the next stage is illustrated in which the first and third stacks from the left have their lower layer 42 actuated such that they no longer contact the inner plate 30. The final movement is illustrated in FIG. 4F where the middle layer of the second and fourth stacks 40 from the left is deactivated such that it returns to its original shape. Because the inner plate 30 is gripped between the second and fourth stacks 40 from the left on both sides, when the piezoelectric layer 43 of those stacks is deactivated the inner plate 30 moves to the right with respect to plates 20, 25. Each step can result in a movement of the inner plate 30 relative to the outer plates 20, 25 of between 1 to 4 μm.

If further movement to the right is needed this can either be accomplished by activating the middle layer 43 of the first and third stacks and proceeding through the stages illustrated in FIGS. 4D and E except for performing those acts illustrated on the second and fourth stacks on the first and third stacks and visa versa. Alternatively, the piezoelectric layer 42 of the first and third stacks from FIG. 4F can be deactivated such that further movement is achieved by taking stages illustrated in FIGS. 4A to F once again.

It will be appreciated that if the other layer 44 which is orientated in a direction of expansion/contraction parallel to the plane of the plates 20, 25, 30 is actuated, movement in/out of the page can be achieved. Of course composite movement can also be achieved.

The above described stepping motion with reference to FIG. 4 results in a relatively coarse adjustment of position. Fine adjustment of position is possible by shearing individual layers of the piezoelectric stacks by an amount effective to bring around the desired movement whilst those stacks are kept in contact with the relevant plate 20, 25, 30.

Figure 5:
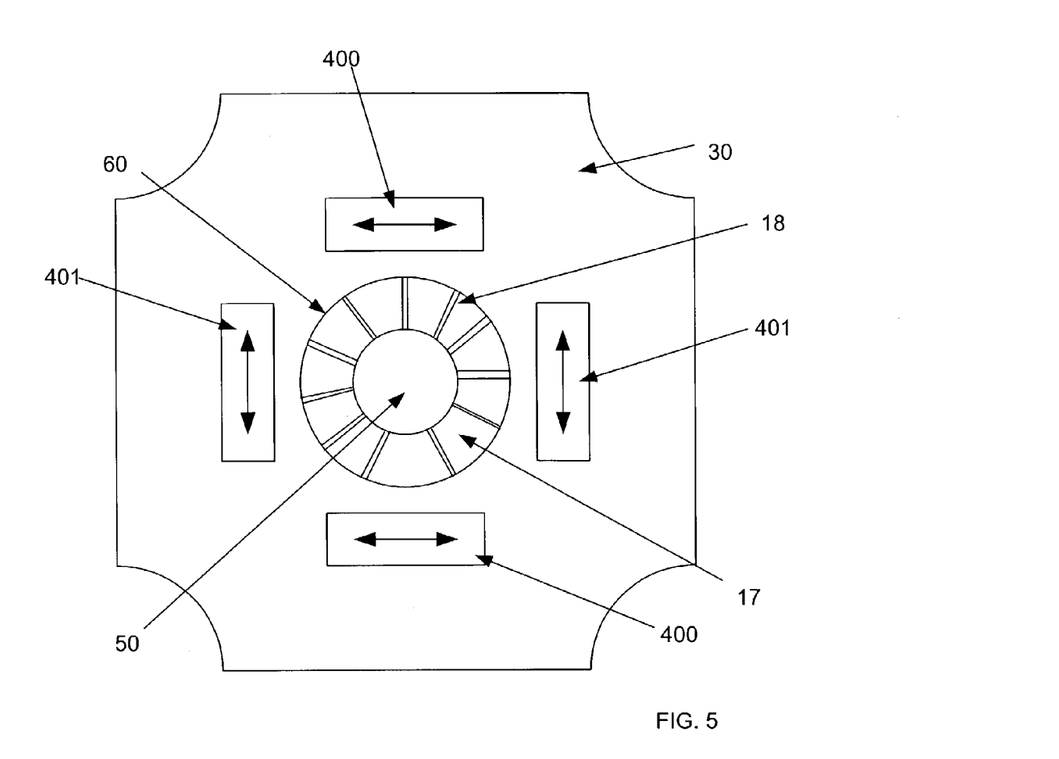
FIG. 5 illustrates a cross section of a third embodiment of a two-dimensional piezoelectric actuator in a plane parallel to inner plate.

FIG. 5 illustrates a third embodiment of two-dimensional actuator. In the embodiment illustrated in FIG. 5, the structure of the outer plates 20, 25 and inner plate 30 as well as of central pin 50 is the same as that of the first embodiment. The difference lies in the piezoelectric stacks 40. In the embodiment illustrated in FIG. 5 there are only four piezoelectric stacks 400, 401. All four of those stacks only comprise two piezoelectric layers. All four stacks have one piezoelectric layer which expands/contracts to bring the piezoelectric stack into and out of contact with the inner (or outer) plate 20, 25, 30. The second layer of each of the stacks 400, 401 is orientated for shear. Two of the stacks 400 have layers orientated for shear in the X direction and the other two of the stacks 401 have layers orientated for shear in the Y direction which is perpendicular to the X direction. The piezoelectric stacks 400, 401 are preferably positioned on both sides of the inner plate 30, but the stacks can also be positioned merely on one side of the inner plate. In such cases, on the other side of the inner plate 30 a bearing structure between the inner plate 30 and the outer plate 20, 25 is provided to keep those plates a constant distance apart such as grease or ball-bearings.

Coarse movement in the X and Y direction can only be performed separately. For example, for coarse movement in the X direction whilst the inner plate 30 is supported by the Y stacks 401, one layer of the X stacks 400 contracts and the other layer shears. On expansion of that expansion/contraction layer, the X stacks 400 re-engage with the inner plate 30. On contraction of the expansion/contraction layer of the Y stacks 401 and shear of the shear layers in the X stack 410, the plate 30 will move in the X direction. Repetition of these steps results in a stepping of the inner plate 30 in the X direction. Movement in the Y direction is accomplished in a similar manner.

Fine movement of the actuator illustrated in FIG. 5 is possible in one of two ways: the first way for movement in the Y direction is for the X piezoelectric stacks 400 to have the expansion/contraction layer contracted such that they no longer contact the inner plate 30. Fine movement in the Y direction is then performed by analogue adjustment of the shear of the shear layer in the Y stacks 401. The alternative method for fine adjustment is to leave all four stacks 400, 401 in contact with the inner plate 30 and shear the shear layers of the Y stacks. In this case, the friction of the X stacks must be overcome by the shear layers of the Y stacks 401. In this way, the piezoelectric stacks are generally under strain during fine movement.

In all of the embodiments illustrated in FIGS. 2, 3 and 5, the piezoelectric stacks are placed symmetrically around the membrane 17. This arrangement is most preferred but is not in fact essential and the piezoelectric stacks may be arranged asymmetrically. In fact, with the appropriate bearing structure on each side of the inner plate 30 to maintain a constant plate separation, it can be seen that the two-dimensional actuator could comprise only two, three layer piezoelectric stacks.

Figure 6:
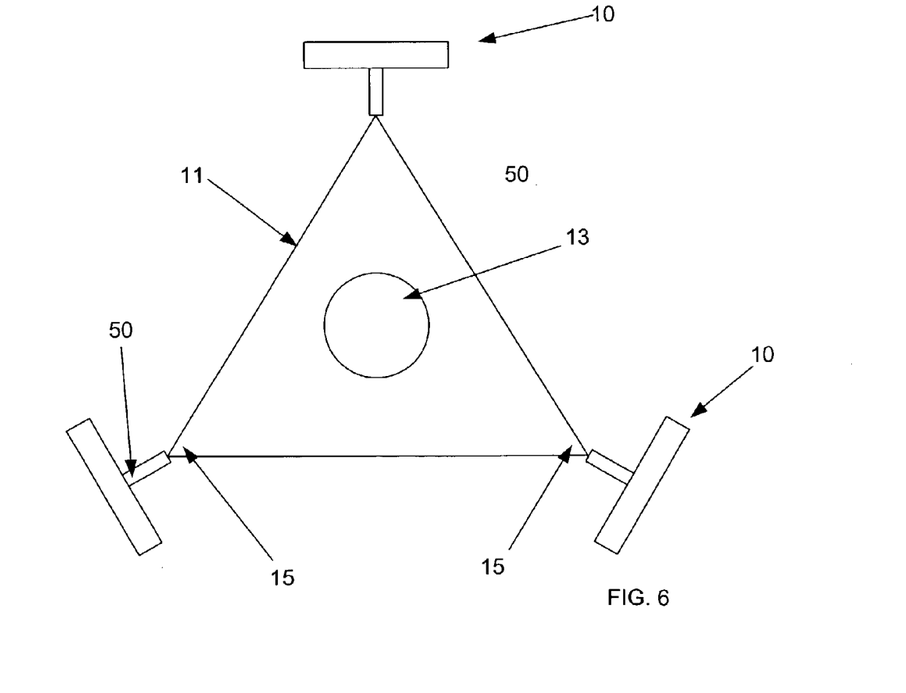
FIG. 6 illustrates a mounting frame and associated two-dimensional piezoelectric actuators for supporting an optical member.

FIG. 6 illustrates a mounting frame 11 having a triangular frame structure. An optical member 13 e.g. a multi layer mirror for EUV radiation, is connected in the center of the mounting frame 11.

The mounting frame 11 comprises three corner blocks 15 that are positioned at the three corners of the triangular structure. Each corner block 15 is connected to a central pin 50 of a two-dimensional piezoelectric actuator 10.

Each of the two-dimensional piezoelectric actuators 10 are positioned such that their plane of movement is perpendicular to the page as illustrated in FIG. 6. This arrangement allows translation of the optical member 13 in two dimensions in the plane of the page as well as rotation in the plane of the page. This is accomplished by translation of the central pins 50 of the two-dimensional piezoelectric actuators 10 in the plane of the page. Movement of the central pins 50 perpendicularly to the page allows height adjustment of the optical member 13 in one dimension and further allows rotation of the optical member 13 in two further dimensions. Thus, with the mounting frame 11 arranged as illustrated in FIG. 6, the optical member 13 may be accurately positioned with six degrees of freedom.

In the illustrated embodiment, the central pins 50 are shown oversized. In order to maintain high stiffness, the central pin 50 must be kept as short as possible so that the distance between the membrane of the piezoelectric actuator and the mounting frame 11 is as small as possible. Alternatively, the mounting frame 11 is connected to one of the outer plates, whereby the central pin 50 extends in a direction away from the mounting frame 11 and is connected to another part of the apparatus. In the preferred embodiment, the position or the corner of the mounting frame coincides with the center of the membrane.

Whilst specific embodiments of the invention have been described above, it will be appreciated that the invention may be practiced otherwise than as described. The description is not intended to limit the invention.

What is claimed is:

1. A lithographic projection apparatus comprising:
   a radiation system for providing a beam of radiation;
   a support structure for supporting a patterning structure, the patterning structure serving to pattern the beam of radiation according to a desired pattern;
   a substrate table for holding a substrate; and
   a projection system for projecting the patterned beam onto a target portion of the substrate,
   wherein at least one of the radiation system and the projection system comprises at least one optical member and a piezoelectric actuator for positioning said optical member such that the piezoelectric actuator is constructed and arranged to position the optical member in two substantially orthogonal directions.

2. An apparatus according to claim 1, wherein said piezoelectric actuator is an inch-worm actuator.

3. An apparatus according to claim 1, wherein said piezoelectric actuator comprises
   two outer plates;
   an inner plate positioned between said two outer plates; and
   at least two piezoelectric stacks positioned on at least one side of said inner plate between said inner plate and one of said two outer plates;
   wherein said outer and inner plates are substantially parallel and said outer plates are biased towards each other by a compression structure.

4. An apparatus according to claim 3, wherein said piezoelectric stacks are secured to said one of said inner or outer plates.

5. An apparatus according to claim 3, wherein said piezoelectric stacks comprise a first layer of piezoelectric material capable of expanding/contracting in a first direction and, a second layer of piezoelectric material capable of expanding/contracting in a second direction, said first and second directions being substantially orthogonal to one another and at least one of said directions having a component in a direction perpendicular to the plane of said inner and outer plates.

6. An apparatus according to claim 5, further comprising a third layer of piezoelectric material capable of expanding/contracting in a third direction, said first, second and third directions all being substantially orthogonal to one another.

7. An apparatus according to claim 3, wherein said one of said two outer plates has a central cut-out through which a central pin attached to said inner plate at one end extends, and a connection between said central pin and said inner plate comprises a membrane-like portion located in a cut-out area of said inner plate and held by said inner plate at its outer circumference, wherein the central pin is connected to a central area of the membrane-like portion.

8. An apparatus according to claim 7, wherein said membrane-like portion comprises a plurality of spokes which extend from the central area to the outer circumference of the central pin.

9. An apparatus according to claim 8, wherein said membrane-like portion comprises a plurality of spokes which extend from the inner plate to a periphery edge of the central cut-out.

10. An apparatus according to claim 3, further comprising a further inner plate, said further inner plate having a central cut-out in which said inner plate is attached by a membrane-like portion.

11. An apparatus according to claim 1, wherein said optical member is supported by a mounting frame, the frame extending in a plane transverse to a path of radiation to or from the optical member and the frame thereby enclosing the optical member, wherein the optical member is connected to the frame and the frame is connected to at least one piezoelectric actuator.

12. An apparatus according to claim 11, wherein said frame comprises a plurality of struts which are connected at corners of the frame so as to form a frame structure with at least three corners and one of said at least one piezoelectric actuators is connected with each of said at least three corners.

* * * * *